United States Patent
Chiu et al.

(10) Patent No.: US 7,662,660 B2
(45) Date of Patent: Feb. 16, 2010

(54) THIN FILM TRANSISTOR ARRAY SUBSTRATE AND FABRICATION METHOD THEREOF

(75) Inventors: Chun-Chang Chiu, Taoyuan County (TW); Wen-Yi Syu, Taoyuan County (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 12/256,967

(22) Filed: Oct. 23, 2008

(65) Prior Publication Data

US 2009/0047750 A1   Feb. 19, 2009

Related U.S. Application Data

(62) Division of application No. 11/337,642, filed on Jan. 23, 2006, now Pat. No. 7,459,725.

(30) Foreign Application Priority Data

Jan. 31, 2005   (TW) .............................. 94102865 A

(51) Int. Cl.
*H01L 51/40* (2006.01)
(52) U.S. Cl. ..................... 438/99; 438/82; 438/149; 438/151
(58) Field of Classification Search .................. 257/40, 257/59, 72; 438/82, 99, 149, 151
See application file for complete search history.

(56) References Cited

U.S. PATENT DOCUMENTS

| | | | | |
|---|---|---|---|---|
| 5,473,168 A | * | 12/1995 | Kawai et al. | 257/61 |
| 5,656,511 A | * | 8/1997 | Shindo | 438/160 |
| 5,866,919 A | * | 2/1999 | Kwon et al. | 257/59 |
| 6,010,923 A | * | 1/2000 | Jinno | 438/158 |
| 6,344,301 B1 | * | 2/2002 | Akutsu et al. | 430/7 |
| 6,413,804 B1 | * | 7/2002 | Jeong | 438/163 |
| 6,590,411 B2 | * | 7/2003 | Lee | 324/770 |
| 7,166,861 B2 | * | 1/2007 | Saito et al. | 257/57 |
| 2002/0042171 A1 | * | 4/2002 | Zhang et al. | 438/151 |

* cited by examiner

*Primary Examiner*—Kenneth A Parker
*Assistant Examiner*—Anthony Ho
(74) *Attorney, Agent, or Firm*—Thomas, Kayden, Horstemeyer & Risley

(57) ABSTRACT

A thin film transistor array substrate is disclosed. A gate electrode is disposed overlying a substrate. A gate dielectric layer covers the substrate and the gate electrode. A semiconductor layer is disposed overlying the gate dielectric layer, wherein the semiconductor layer comprises a channel. A source electrode electrically connects a portion of the semiconductor layer on one side of the channel, and a drain electrode electrically connects a portion of the semiconductor layer on the other side of the channel, in which the drain electrode does not overlap the gate electrode.

4 Claims, 13 Drawing Sheets

US 7,662,660 B2

THIN FILM TRANSISTOR ARRAY SUBSTRATE AND FABRICATION METHOD THEREOF

CROSS-REFERENCE TO RELATED APPLICATION

This application is a divisional of U.S. application Ser. No. 11/337,642, filed on Jan. 23, 2006 now U.S. Pat. No. 7,459,725.

BACKGROUND OF THE INVENTION

The invention relates to liquid crystal display and fabrication thereof, and in particular to a thin film transistor of a liquid crystal display and fabrication thereof.

Liquid crystal display (LCD) is a commonly used flat panel display. Owing to dielectric anisotropy and conductive anisotropy of liquid crystal molecules, molecular orientation of liquid crystals can be shifted under an external electronic field, such that various optical effects are produced.

A LCD panel is generally made up of two substrates, with a cell gap therebetween, and a liquid crystal layer interposed between two substrates. A plurality of electrodes is formed on the two substrates, respectively, to control the orientation and oriental shift of liquid crystal molecules.

FIG. 1 is a plane view of a conventional thin film transistor. Referring to FIG. 1, a thin film transistor controls LCD panel switch on or off, acting as a switch device. A gate electrode 102 overlaps a source electrode 106 and a drain electrode 104, such that a coupling capacitance $C_{gd}$ occurs between the gate electrode 102 and the drain electrode 104. While gate electrode 102 is turned off, pixel potential would be rapidly dropped due to the coupling capacitance. This phenomenon can be named as feed-through effect.

In general, feed-through effect is more serious as coupling capacitance increases. Although feed-through effect can be reduced by increasing storage capacitor ($C_{st}$), however, aperture ratio is reduced accompany with the increase of storage capacitor ($C_{st}$). In addition, when the problems of exposure misalignment or etching unevenly raised, the coupling capacitance $C_{gd}$ would generate short mura at the connections between photo masks, or flicker is generated. The problem described can be eliminated by reduced $C_{gd}$.

SUMMARY

An embodiment of the invention provides a thin film transistor array substrate. A gate electrode is disposed overlying a substrate. A gate dielectric layer covers the substrate and the gate electrode. A semiconductor layer is disposed overlying the gate dielectric layer, comprising a channel. A source electrode electrically connects a portion of the semiconductor layer on one side of the channel, and a drain electrode electrically connects a portion of the semiconductor layer on the other side of the channel, in which the drain electrode does not overlap the gate electrode.

An embodiment of the invention also provides a method for fabricating a thin film transistor array substrate. A gate electrode is formed on a substrate. A gate dielectric layer is formed to cover the substrate and the gate electrode. A light shielding layer is formed on the gate dielectric layer. A portion of the light shielding layer overlying the gate electrode is removed to form an opening in the gate dielectric layer. A semiconductor layer is formed on the light shielding layer and filling the opening, wherein the semiconductor layer comprises a channel. A doped semiconductor layer is formed on the semiconductor layer. The doped semiconductor layer and the semiconductor layer are patterned, wherein at least on side of the patterned doped semiconductor layer and the patterned semiconductor layer extend beyond the gate electrode. The light shielding layer is etched using the patterned doped semiconductor layer as a mask, wherein the etched light shielding layer is used for shielding a portion of the semiconductor layer from the light. A source electrode is formed electrically connecting a portion of the semiconductor layer on one side of the channel. A drain electrode is formed electrically connecting a portion of the semiconductor layer on the other side of the channel, wherein the drain electrode does not overlap the gate electrode.

An embodiment of the invention further provides a liquid crystal display panel. A second substrate is opposite a first substrate. A thin film transistor is disposed on the first substrate, comprising a gate electrode disposed overlying the first substrate, a gate dielectric layer covering the first substrate and the gate, a semiconductor layer disposed overlying the gate dielectric layer, wherein the semiconductor layer comprises a channel, a source electrode electrically connecting a portion of the semiconductor layer on one side of the channel, a drain electrode electrically connecting a portion of the semiconductor layer on the other side of the channel, wherein the drain electrode does not overlap the gate electrode, and a liquid crystal layer interposed between the first substrate and the second substrate.

BRIEF DESCRIPTION OF THE DRAWINGS

The invention can be more fully understood by reading the subsequent detailed description and examples with reference to the accompanying drawings, wherein.

DETAILED DESCRIPTION OF THE INVENTION

Figure 1:
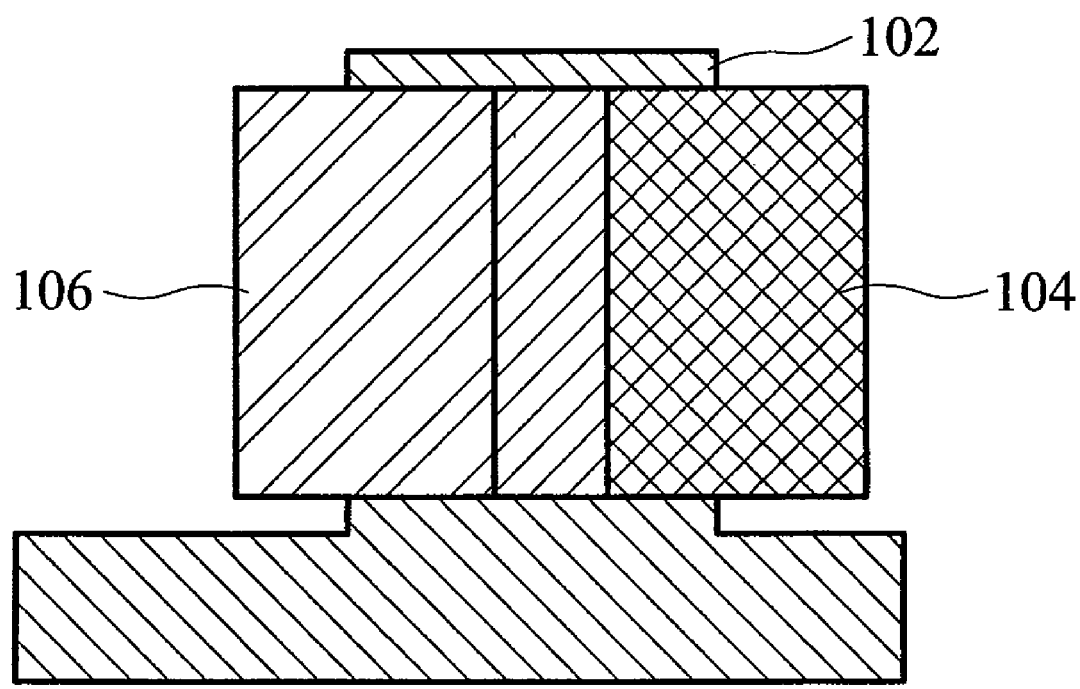
FIG. 1 is a plane view of conventional thin film transistor.

Embodiments of the invention, which provides a liquid crystal display and fabricating methods thereof, will be described in greater detail by referring to the drawings that accompany the invention. It is noted that like and/or corresponding elements are referred to by like reference numerals in the accompanying drawings.

The following description discloses the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers.

Figure 2A:
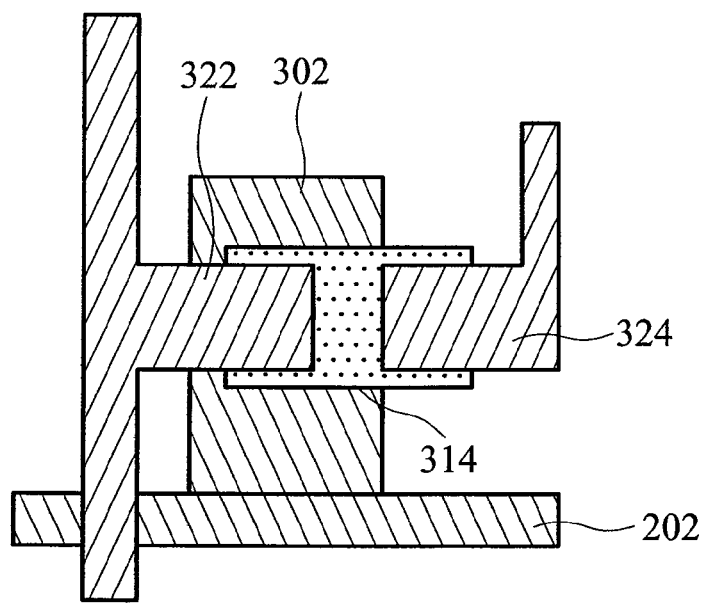
FIG. 2A is a partial top view of a thin film transistor array substrate of an embodiment of the invention.
Figure 2B:
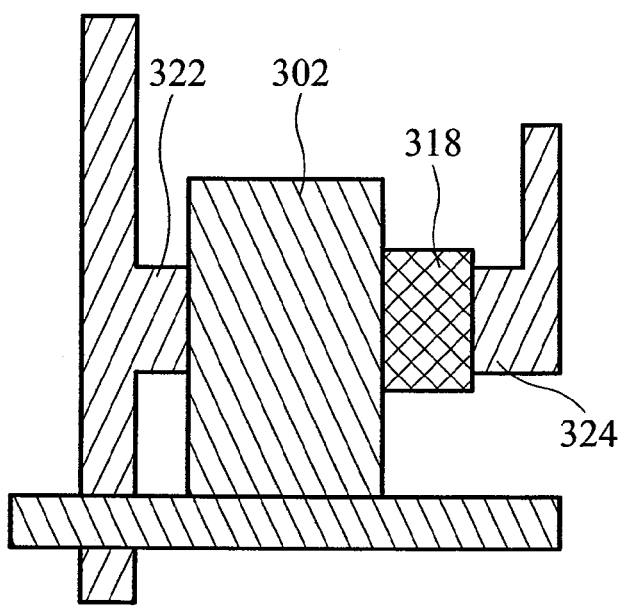
FIG. 2B is a partial bottom view of a thin film transistor array substrate of an embodiment of the invention.
Figure 2C:
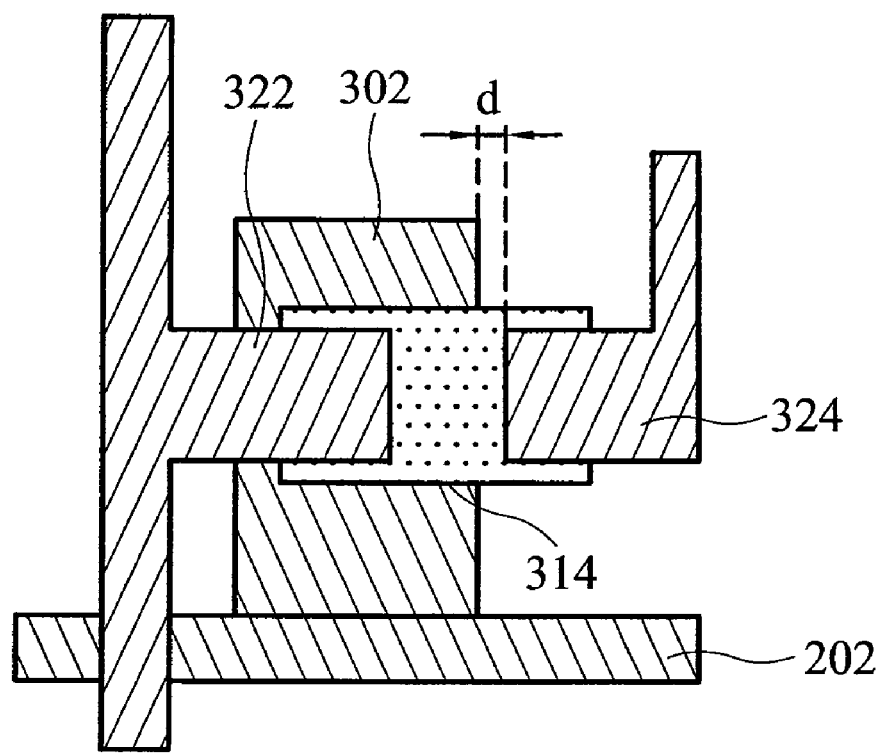
FIG. 2C is a partial top view of a thin film transistor array substrate of another embodiment of the invention.

FIG. 2A is a partial top view of a thin film transistor array substrate of an embodiment of the invention. FIG. 2B is a partial bottom view of a thin film transistor array substrate of an embodiment of the invention. FIG. 3I is a cross sectional view of a thin film transistor array substrate of an embodiment of the invention. Referring to FIGS. 2A, 2B and 3I, a gate electrode 302 connectable to a gate line 202 is disposed on a substrate 300. A gate dielectric layer 308 covers the gate electrode 302 and the substrate 300. A light shielding layer 318 is disposed on or over the gate dielectric layer 308, in which a resist layer can be interposed between the light shielding layer 318 and the gate dielectric layer 308. In an embodiment of the invention, the light shielding layer 318 connects the gate electrode 302 completely covering the semiconductor layer 314 to avoid leakage when the semiconductor layer is illuminated. In another embodiment of the invention, the light shielding layer 318 is adjacent to the gate electrode 302 with a gap d therebetween, as shown in FIG. 2C. In yet another embodiment of the invention, the semiconductor layer 314 covers a portion of the gate dielectric layer 308 and the light shielding layer 318. At least one side of the semiconductor layer 314 has a non-overlapping area extending beyond the gate electrode 302.

Due to its photosensitive characteristics, the semiconductor 314 is likely to generate photo-current when illuminated. Consequently, the light shielding layer 318 is disposed in the non-overlapping area of the semiconductor layer 314 and adjacent to the gate dielectric layer 308 to eliminate leakage of the thin film transistor. The source electrode 322 is disposed overlying the semiconductor layer 302, and overlaps a portion of the gate 302. Additionally, the drain electrode 324 is disposed overlying the semiconductor layer 314, and does not overlap the gate 302. In an embodiment of the invention, the semiconductor layer 314 extends beyond the gate 302, and the drain electrode 324 overlaps a portion of the semiconductor layer 314 extending beyond the gate 302 to reduce Cgd from overlapping of the gate with the drain electrode. In another embodiment, on the rear, the semiconductor layer 314 is completely covered by the gate 302 and the light shielding layer 318 to eliminate leakage from illumination of the semiconductor layer 314, as shown in FIG. 2B. In addition, a doped semiconductor layer 316 can be interposed between the source electrode 322/drain electrode 324 and the semiconductor layer 314 to reduce contact resistance.

Figure 3A:
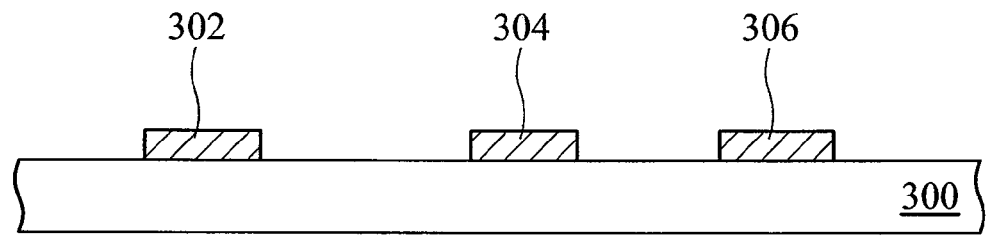
FIG. 3A-FIG. 3L illustrate a process flow for forming a thin film transistor array substrate.
Figure 3B:
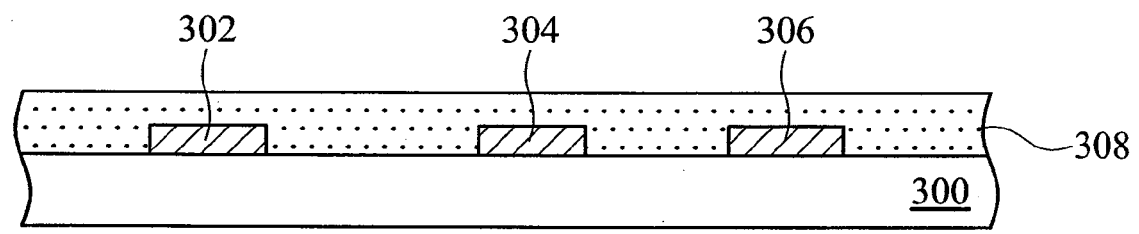
Figure 3C:
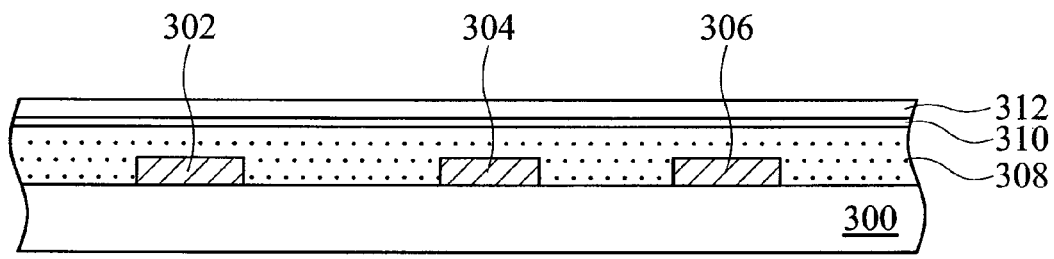
Figure 3D:
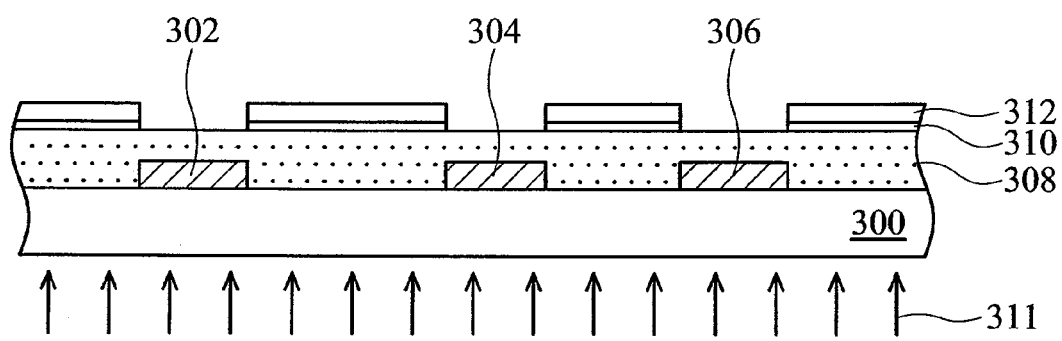
Figure 3E:
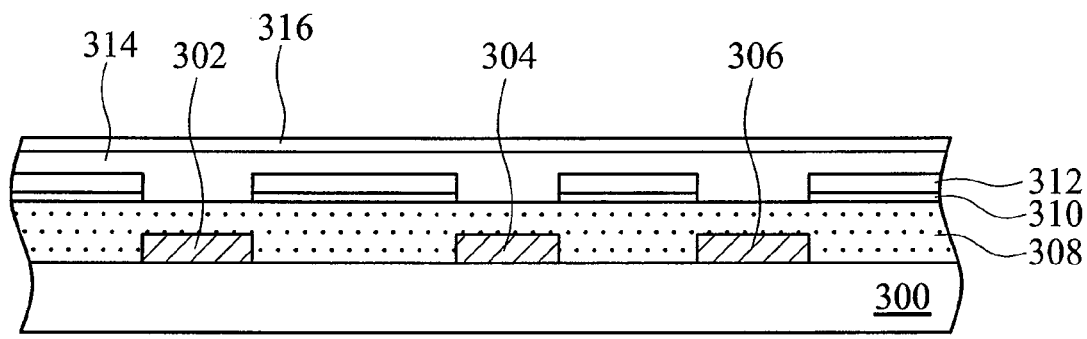
Figure 3F:
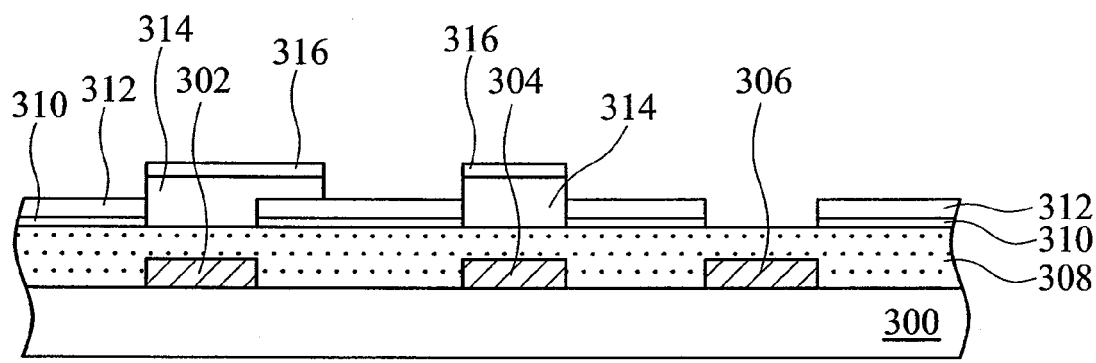
Figure 3G:
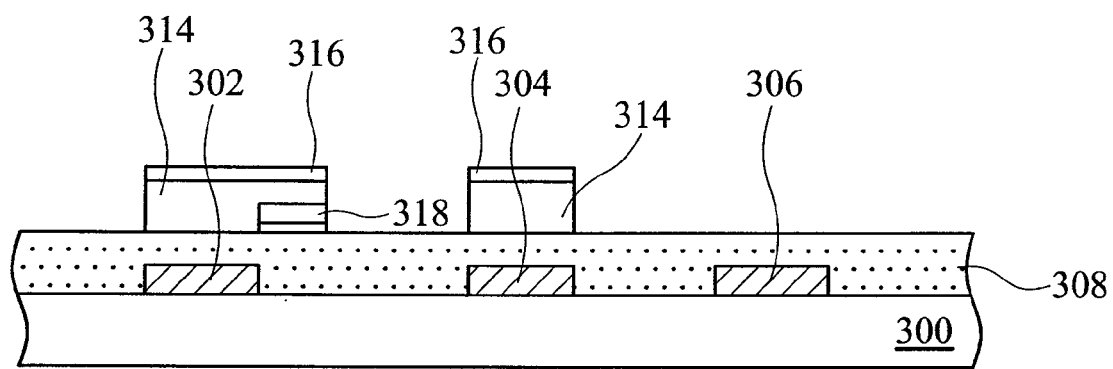
Figure 3H:
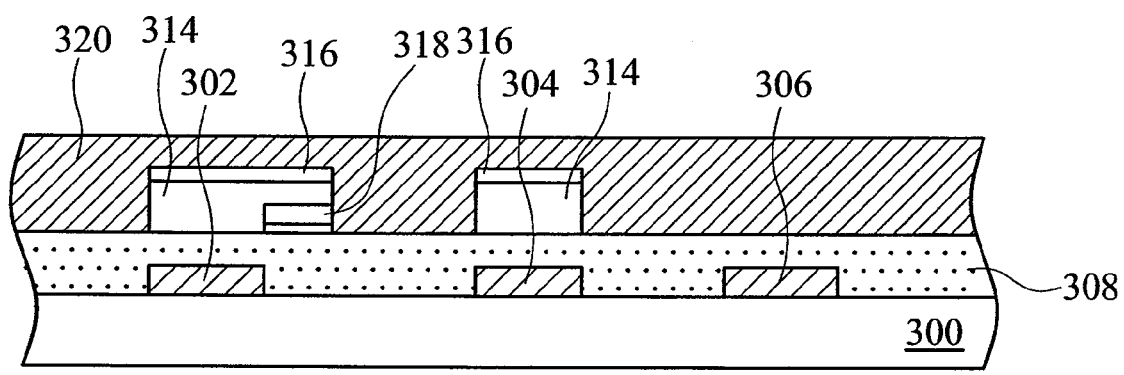
Figure 3I:
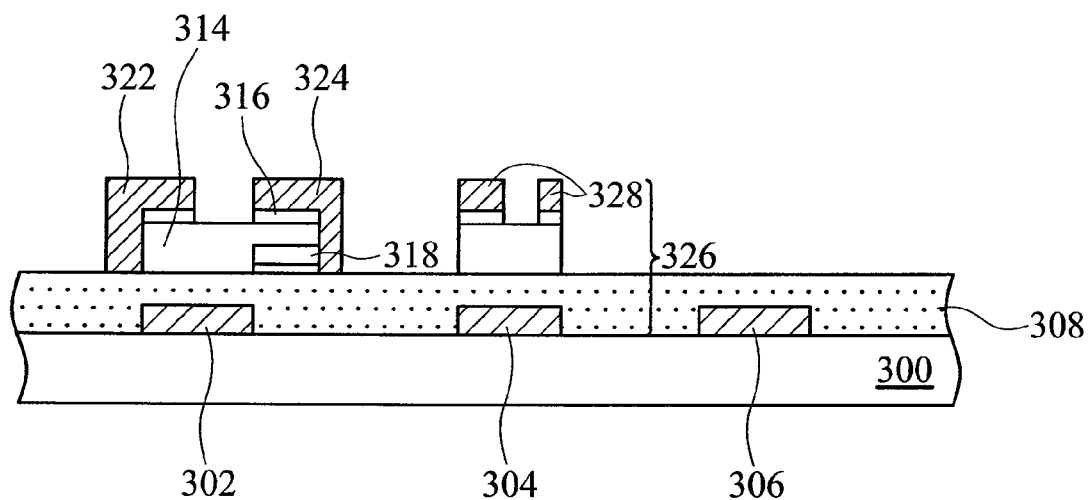

FIGS. 3A~3L illustrate a process flow for forming a thin film transistor array substrate. Referring to FIG. 3A, a substrate 300, such as glass substrate, and preferably a low alkali glass substrate or a non alkali glass substrate, is provided. Next, a first metal layer (not shown) is formed on the substrate 300 by deposition. The first metal layer can be Ta, Mo, W, Ti, Cr, Al, a combination thereof or a stacked layer thereof. The deposition described can be plasma vapor deposition PVD, or plasma enhanced chemical vapor deposition PECVD. The first metal layer is patterned by conventional photo-lithography and etching to form a gate electrode 302, a bottom electrode 304 of a storage capacitor and a contact metal pad 306.

Referring to FIG. 3B, a gate dielectric layer 308 is formed on the gate electrode 302, the bottom electrode 304 of the storage capacitor, the contact metal pad 306 and the substrate 300 by deposition. The gate dielectric layer 308 can be silicon oxide, silicon nitride, silicon oxynitride or a combination thereof. Referring to FIG. 3C, a photoresist layer 310 is formed on the gate dielectric layer 308. Preferably, the photoresist layer 310 is a negative type photo-resist, to be defined by photolithography with back exposure. Next, a light shielding layer 312, for example Ta, Mo, W, Ti, Cr, Al, a combination thereof or a stacked layer thereof, is formed on the photoresist layer 310 by deposition, preferably low temperature deposition, such as PVD or PECVD.

Referring to FIG. 3D, the photoresist layer is exposed from the backside of the substrate using the patterned conductive layer (the gate electrode 302, the bottom electrode 304 of the storage capacitor and the contact metal pad 306) as a mask, patterning the resist layer 310 by self-alignment. Next, a lift-off process is performed in the following steps. In an embodiment of the invention, the non-exposed resist layer 310 overlying the patterned conductive layer 302, 304 and 306 is removed by development according to the negative characteristic thereof, the light shielding layer 312 overlying the resist layer 310 is lifted off simultaneously. Consequently, the resist layer 310 and the light shielding layer 312 are patterned to form openings corresponding to and overlying the gate electrode 302, the bottom electrode 304 of the storage capacitor and the contact metal pad 306. According to the lift-off step of the embodiment, a lithography step is reduced. The invention, however, is not limited thereto. Pattering of the light shielding layer 312 can be accomplished by conventional lithography and etching.

Referring to FIG. 3E, a semiconductor layer 314 is formed on the light shielding layer 312 by deposition and fills the openings corresponding to the gate electrode 302, the bottom electrode 304 of the storage capacitor and the contact metal pad 306 described. A doped semiconductor layer 316 is formed on the semiconductor layer 314 by deposition. In an embodiment of the invention, the semiconductor layer 314 is Si, Ge, polysilicon or amorphous silicon. The doped semiconductor 316 is an n+ semiconductor layer, for example Si or Ge doped with P or As, to reduce contact resistance.

Referring to FIG. 3F, the doped semiconductor layer 316 and the semiconductor layer 314 are patterned by conventional lithography and etching. Specifically, a portion of the doped semiconductor layer 316 and the semiconductor layer 314 overlying the gate electrode 302 and the neighboring region thereof, and beyond the region overlying the bottom electrode 304 of the storage capacitor are removed. At least one side of the doped semiconductor layer 316 and semiconductor layer 314 extends beyond the gate electrode 302. In the preferred embodiment, the doped semiconductor layer 316 and semiconductor layer 314 extend beyond the gate electrode 302 on one side, the invention, however, is not limited thereto. Next, referring to FIG. 3G, the light shielding layer 312 and the photoresist layer 310 thereunder are etched by anisotropic etching using patterned doped semiconductor layer 316 as a mask. In the embodiment, the light shielding layer in the semiconductor layer 314 acts as a light shielding layer 318 to eliminate leakage from the semiconductor layer 314 being illuminated.

Referring to FIG. 3H, a third conductive layer 320 is formed on the doped semiconductor layer 316 and the gate dielectric layer 308 by blanket deposition. The third conductive layer 320 can be Ta, Mo, W, Ti, Cr, Al, a combination thereof or the stacked layer thereof. Next, referring to FIG. 3I, the third conductive layer 320 and the doped semiconductor layer 316 are patterned by conventional lithography and etching to form source electrode 322, drain electrode 324 and a top electrode 328 of the storage capacitor overlying the semiconductor layer 314. Specifically, the drain electrode 324 does not overlap the gate electrode 302 to reduce coupling capacitance ($C_{gd}$). In an embodiment of the invention, the drain electrode is supported by a portion of the semiconductor layer 314 extending beyond the gate electrode 302.

Figure 3J:
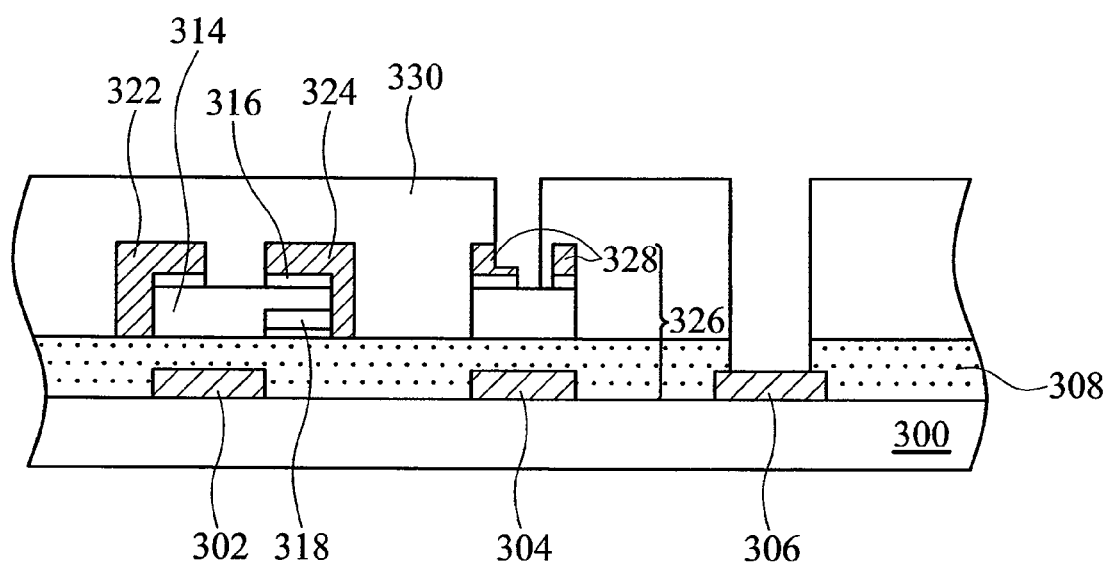
Figure 3K:
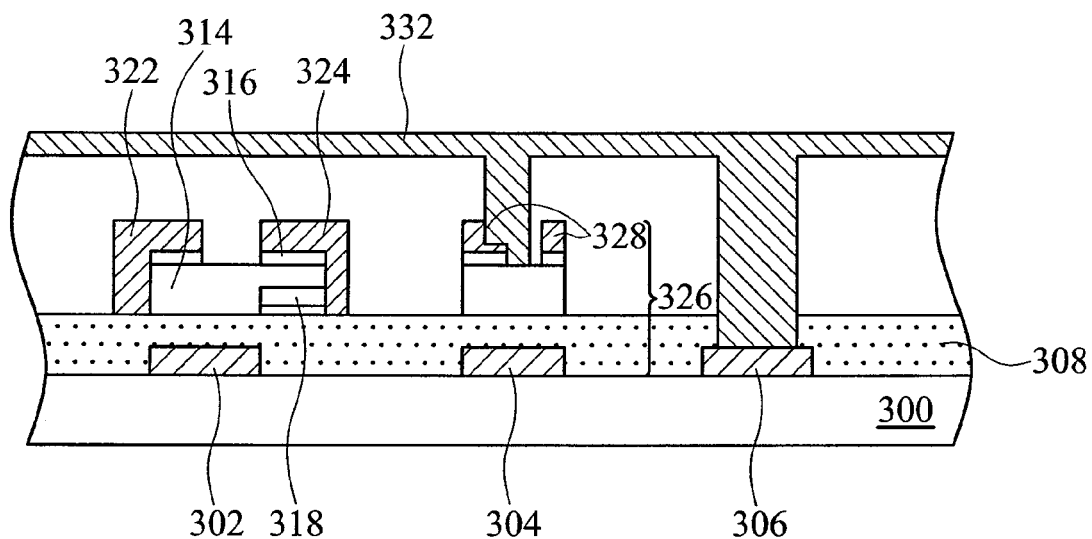
Figure 3L:
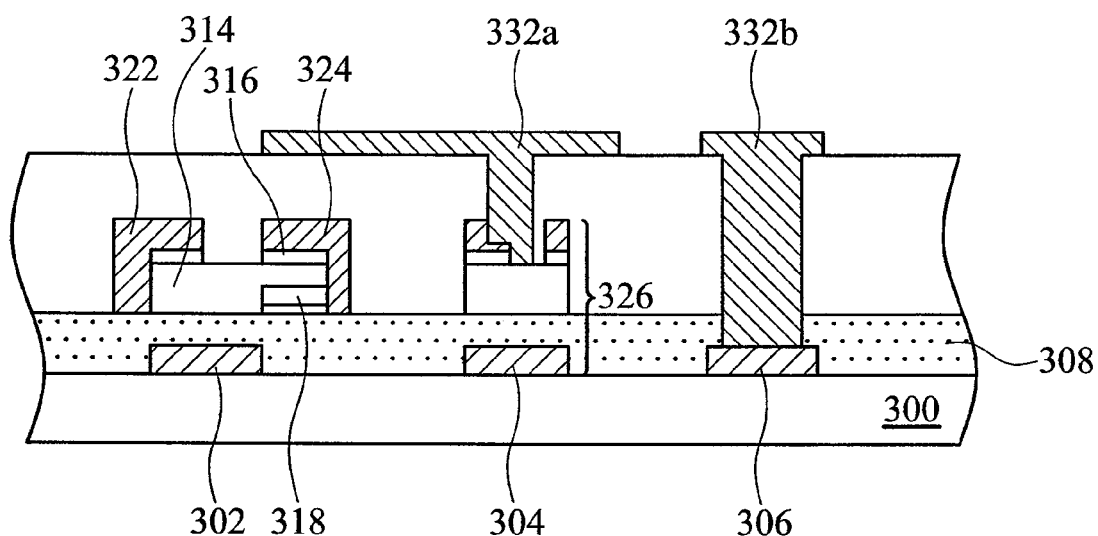

Next, referring to FIG. 3J, a protective layer 330 is formed on the source electrode 322, the drain electrode 324, the top electrode 328 of the capacitor and the gate dielectric layer 308 by blanket deposition. The protective layer 330 can be silicon nitride or silicon oxynitride. Thereafter, the protective layer 330 and the top electrode 328 of the storage capacitor are patterned to form openings overlying and corresponding to the storage capacitor and the contact pad 306. Referring to FIG. 3K, a transparent electrode 332, such as indium tin oxide ITO, is formed on the protective layer 330 by blanket deposition and fills the openings described to electrically connect the top electrode 328 of the storage capacitor and the contact pad 306. Referring to FIG. 3L, the transparent conductive layer 332 is patterned to form a pixel electrode 332a electrically connecting the storage capacitor 326, and a contact electrode 332b connecting to the connect pad 306.

Figure 4:
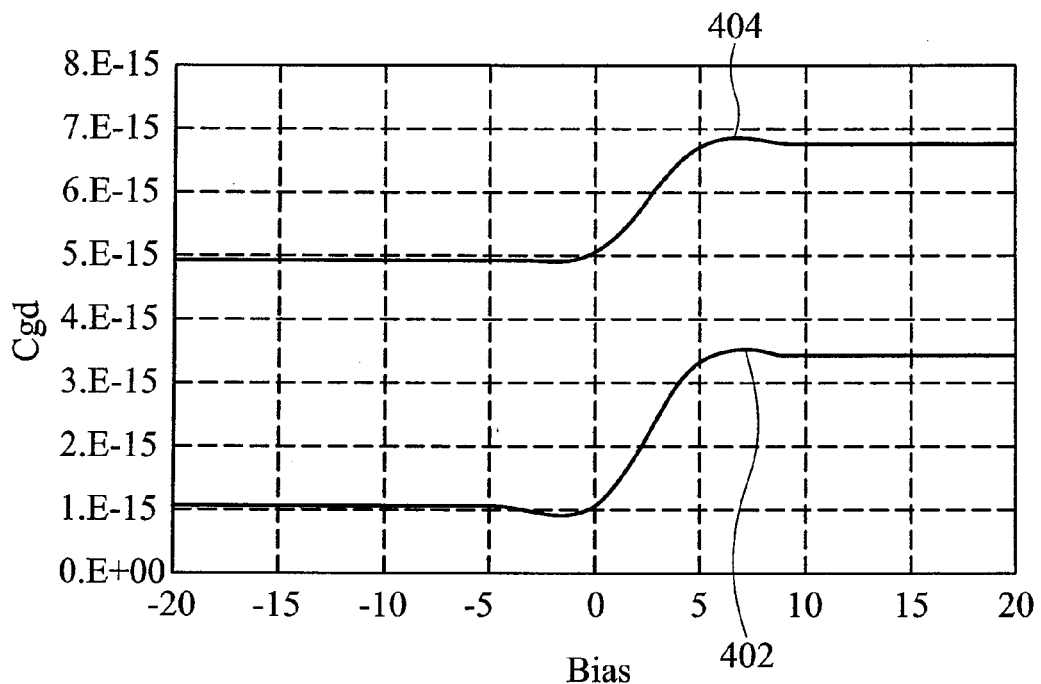
FIG. 4 shows a diagram of bias versus Cgd between conventional TFT structure and the TFT structure of an embodiment of the invention.
Figure 5:
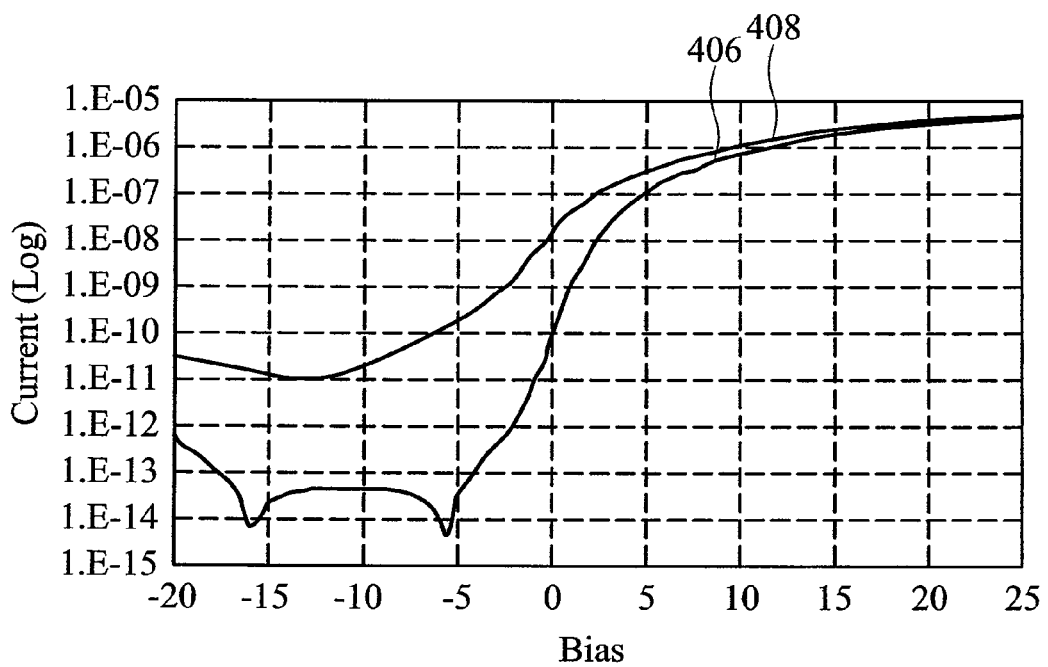
FIG. 5 shows a diagram of bias versus Cgd between TFT structures with and without a light shielding layer.

FIG. 4 shows a diagram of bias versus $C_{gd}$ between conventional TFT structure and the TFT structure of an embodiment of the invention (the structure of FIG. 2A). As shown in FIG. 4, the $C_{gd}$ 402 of the TFT structure of an embodiment of the invention is 80% lower than one of conventional technology 404. FIG. 5 shows a diagram of bias versus $C_{gd}$ between TFT structures with and without a light shielding layer 406 and 408. As shown in FIG. 5, the light shielding layer can effectively reduce leakage current of a thin film transistor when Vds lower than about 10V.

Figure 6A:
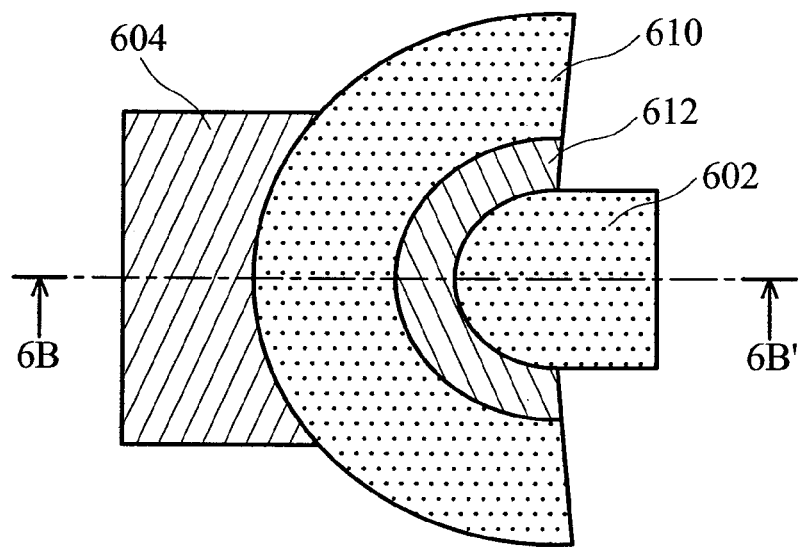
FIG. 6A is a partial top view of a TFT structure of an embodiment of the invention.
Figure 6B:
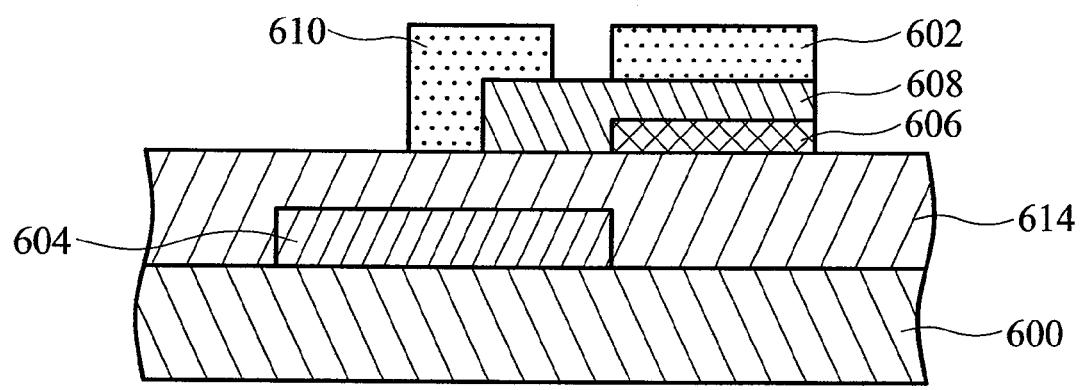
FIG. 6B is a cross sectional view along line 6B-6B' of FIG. 6A.

FIG. 6A is a partial top view of a TFT structure of an embodiment of the invention. FIG. 6B is a cross sectional view along line 6B-6B' of FIG. 6A. The TFT structure of the embodiment is similar to that of FIG. 2A, in which the drain electrode 602 does not overlap the gate electrode 604, and a light shielding layer 606 is disposed in a semiconductor layer 608 to reduce leakage. The difference therebetween is that the source electrode 610 is arc and surrounds the drain electrode 602 with a fixed distance therebetween. The semiconductor layer 608 is disposed underlying the source electrode 610 and the drain electrode 602, and a portion of the semiconductor layer 608 overlaps the source electrode 610 and the drain electrode 602, respectively. The semiconductor layer 608 underlying a gap between the source electrode and the drain electrode acts as a channel 612 of the TFT. A gate electrode 604 is disposed underlying a gate dielectric layer 614 underlying the source electrode 610, the drain electrode 602 and the semiconductor layer 608, and adjacent to a substrate 600. Specifically, the gate electrode 604 does not overlap the drain electrode 602.

Figure 7A:
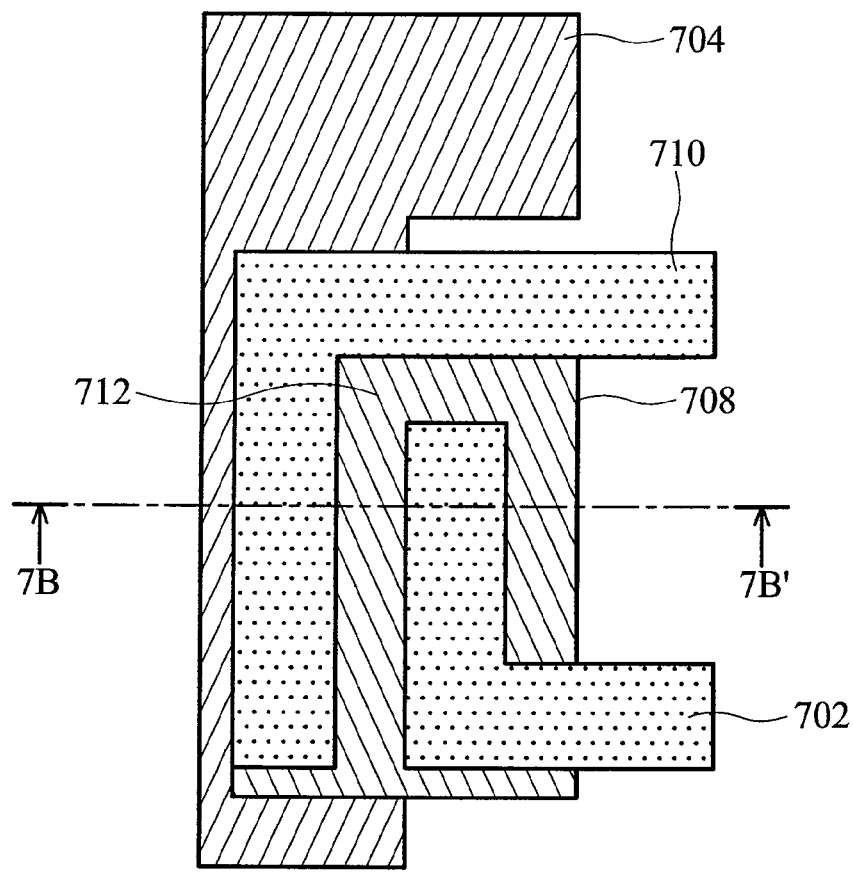
FIG. 7A is a partial top view of a TFT structure of another embodiment of the invention.
Figure 7B:
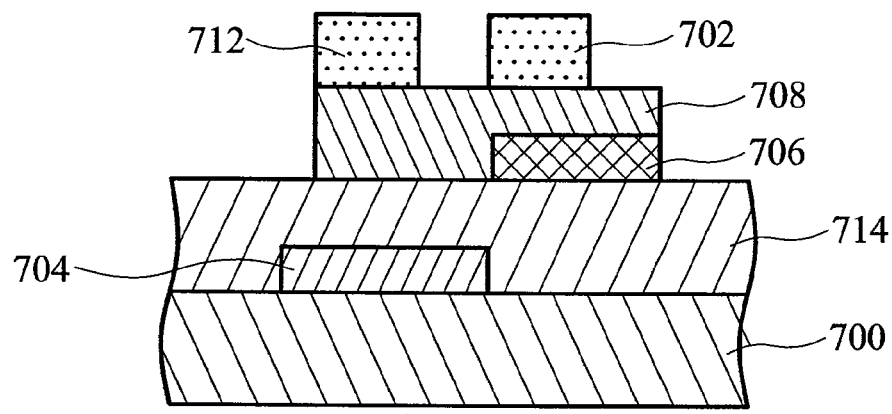
FIG. 7B is a cross sectional view along line 7B-7B' of FIG. 7A.

FIG. 7A is a partial top view of a TFT structure of another embodiment of the invention. FIG. 7B is a cross sectional view along line 7B-7B' of FIG. 7A. The TFT structure of the embodiment is similar to that of FIG. 2A, in which the drain electrode 702 does not overlap the gate electrode 704, and a light shielding layer 706 is disposed in a semiconductor layer 708 to reduce leakage current. The difference therebetween is that the drain electrode 702 is L-shaped and the source electrode 710 is reverse L-shaped with a fixed distance therebetween. The semiconductor layer 708 underlying a gap between the source electrode 710 and the drain electrode 702 acts as a channel 712 of the TFT. A gate electrode 704 is disposed underlying a gate dielectric layer 714 underlying the source electrode 710, the drain electrode 702 and the semiconductor layer 708, and adjacent to a substrate 700. Specifically, the gate electrode 704 does not overlap the drain electrode 702.

Figure 8A:
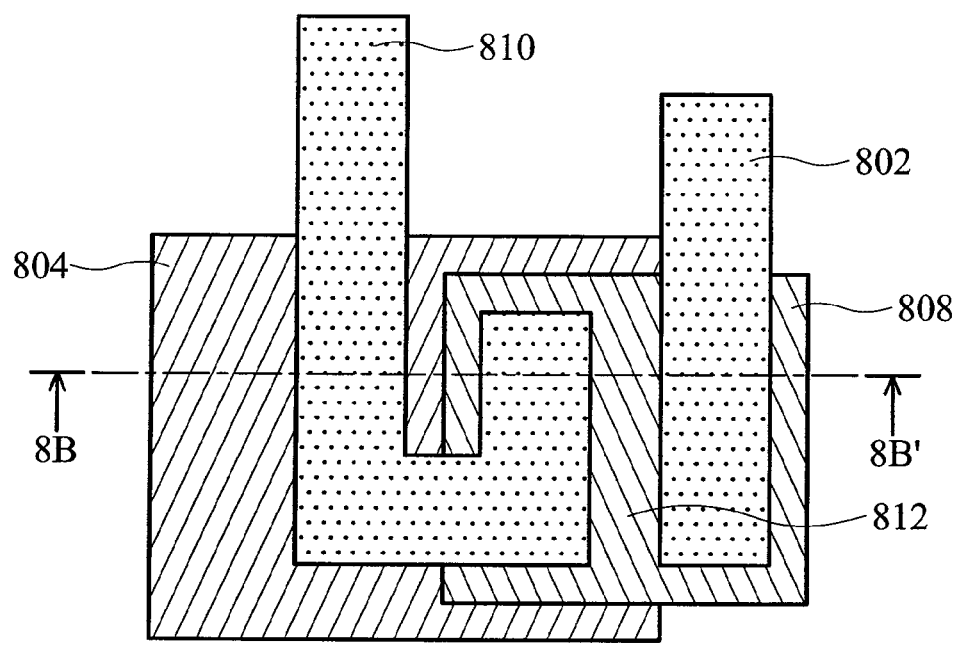
FIG. 8A is a partial top view of a TFT structure of another embodiment of the invention.
Figure 8B:
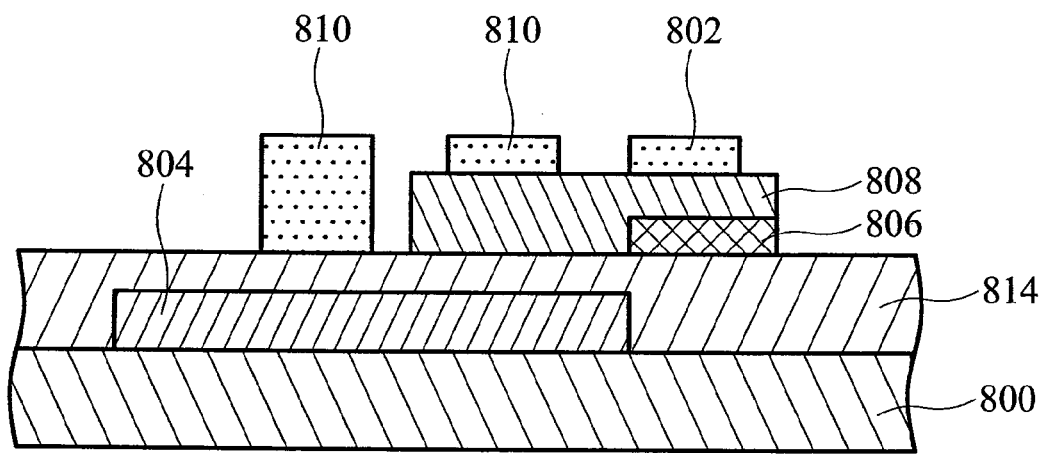
FIG. 8B is a cross sectional view along line 8B-8B' of FIG. 8A.

FIG. 8A is a partial top view of a TFT structure of further another embodiment of the invention. FIG. 8B is a cross sectional view along line 8B-8B' of FIG. 8A. The TFT structure of the embodiment is similar to the one of FIG. 2A, in which the drain electrode 802 does not overlap the gate electrode 804, and a light shielding layer 806 is disposed in a semiconductor layer 808 to reduce leakage. The difference therebetween is that the drain electrode 802 is rectangle and the source electrode 810 is hook-shaped with a fixed distance therebetween. The semiconductor layer 808 underlying a gap between the source electrode 810 and the drain electrode 802 acts as a channel 812 of the TFT. A gate electrode 804 is disposed underlying a gate dielectric layer 814 underlying the source electrode 810, the drain electrode 802 and the semiconductor layer 808, and adjacent to a substrate 800. Specifically, the gate electrode 804 does not overlap the drain electrode 802.

The TFT array substrate in the embodiments described is an element of a liquid crystal display panel, which further comprises a top substrate opposite to the TFT array substrate. In an embodiment of the invention, the top substrate can be a color filter substrate. A liquid crystal layer can be interposed between the color filter substrate (herein referred to as a top substrate) and the TFT array substrate. The element corresponding to the description is not shown in the figure for simplifying.

Due to non-overlapping of the gate electrode and the drain electrode of the TFT structure of an embodiment of the invention, Cgd is reduced to eliminate feed-through effect. In addition, a light shielding layer is further provided to eliminate current leakage from a semiconductor layer being illuminated.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a thin film transistor array substrate, comprising:

providing a substrate;

forming a gate electrode on the substrate;

forming a gate dielectric layer on the substrate and the gate;

forming a light shielding layer on the gate dielectric layer;

removing a portion of the light shielding layer on the gate electrode to form an opening in the gate dielectric layer;

forming a semiconductor layer on the light shielding layer and filling the opening, wherein the semiconductor layer comprises a channel;

forming a doped semiconductor layer on the semiconductor layer;

patterning the doped semiconductor layer and the semiconductor layer, wherein at least one side of the patterned doped semiconductor layer and the pattern semiconductor layer extend beyond the gate electrode;

etching the light shielding layer using the patterned doped semiconductor layer as a mask;

forming a source electrode electrically connecting a portion of the semiconductor layer on one side of the channel; and forming a drain electrode electrically connecting a portion of the semiconductor layer on the other side of the channel, wherein the drain electrode does not overlap the gate electrode.

2. The method for forming a thin film transistor array substrate as claimed in claim 1, further comprising the step of forming a resist layer on the gate dielectric layer, prior to the step of forming the light shielding layer.

3. The method for forming a thin film transistor array substrate as claimed in claim 2, wherein the step of removing a portion of the light shielding layer on the gate electrode comprises:

exposing the resist layer from the backside of the substrate using the gate electrode as a mask; and removing a portion of the resist layer which is not exposed and simultaneously striping the light shielding layer on the portion of resist layer.

4. The method for forming a thin film transistor array substrate as claimed in claim 3, wherein the resist layer is a negative resist, and the step of removing a portion of the resist layer which is not exposed is accomplished by developing.

* * * * *